(12) United States Patent
Zeliff et al.

(10) Patent No.: US 9,886,104 B2
(45) Date of Patent: Feb. 6, 2018

(54) STYLUS FOR CAPACITIVE TOUCHSCREEN

(71) Applicant: Adonit Co., Ltd., Taipei (TW)

(72) Inventors: Zachary Joseph Zeliff, Taipei (TW); Yueh Hua Li, Taipei (TW); TK Kao, Taipei (TW); Joseph Lin, Taipei (TW); Kuang Hou, Taipei (TW)

(73) Assignee: Adonit Co., Ltd., Taipei (TW)

( * ) Notice: Subject to any disclaimer, the term of this patent is extended or adjusted under 35 U.S.C. 154(b) by 0 days.

(21) Appl. No.: 14/441,513

(22) PCT Filed: Feb. 18, 2014

(86) PCT No.: PCT/US2014/017004
§ 371 (c)(1),
(2) Date: May 8, 2015

(87) PCT Pub. No.: WO2014/127383
PCT Pub. Date: Aug. 21, 2014

(65) Prior Publication Data
US 2015/0309598 A1    Oct. 29, 2015

Related U.S. Application Data

(60) Provisional application No. 61/765,788, filed on Feb. 17, 2013, provisional application No. 61/882,159, filed on Sep. 25, 2013.

(51) Int. Cl.
*G06F 3/0354* (2013.01)
*G06F 3/044* (2006.01)

(52) U.S. Cl.
CPC .......... *G06F 3/03545* (2013.01); *G06F 3/044* (2013.01)

(58) Field of Classification Search
CPC ....................... G06F 3/03545; G06F 3/044
See application file for complete search history.

(56) References Cited

U.S. PATENT DOCUMENTS

| | | |
|---|---|---|
| 4,670,989 A | 6/1987 | Juengel |
| 5,274,336 A | 12/1993 | Crook et al. |
| 5,790,106 A | 8/1998 | Hirano et al. |
| 7,612,767 B1 | 11/2009 | Griffin et al. |
| 8,199,132 B1 | 6/2012 | Oda et al. |
| 2008/0074131 A1 | 3/2008 | Kim |
| 2010/0170726 A1* | 7/2010 | Yeh .......... G06F 3/044 178/19.03 |
| 2012/0062521 A1 | 3/2012 | Ahn et al. |
| 2012/0154340 A1* | 6/2012 | Vuppu .......... G06F 3/044 345/179 |
| 2012/0194484 A1* | 8/2012 | Lehman .......... G06F 3/044 345/179 |
| 2012/0223919 A1* | 9/2012 | Lin .......... G06F 3/044 345/179 |

(Continued)

*Primary Examiner* — Sanjiv D Patel

(57) ABSTRACT

Embodiments of amplifiers and electrodes for capacitive styluses are disclosed. The amplifiers detect an input signal from a capacitive touch sensor, such as a touchscreen or touchpad, amplify and invert the signal, and emit the amplified and inverted signal to cause the capacitive touch sensor to detect a touch. The electrode sets, or tips, pair a sensing electrode and an emitting electrode, shielded from each other to limit interference, in a fine-point non-deforming configuration that improves usability over existing stylus tips.

8 Claims, 13 Drawing Sheets

(56) References Cited

U.S. PATENT DOCUMENTS

2012/0327045 A1* 12/2012 Skinner ............... G06F 3/03545
                                                                345/179
2013/0002606 A1    1/2013 Mann
2013/0106718 A1*  5/2013 Sundara-Rajan ....... G06F 3/038
                                                                345/173
2013/0194242 A1*  8/2013 Park .................... G06F 3/03545
                                                                345/179
2014/0062968 A1*  3/2014 Skinner ............... G06F 3/03545
                                                                345/179

* cited by examiner

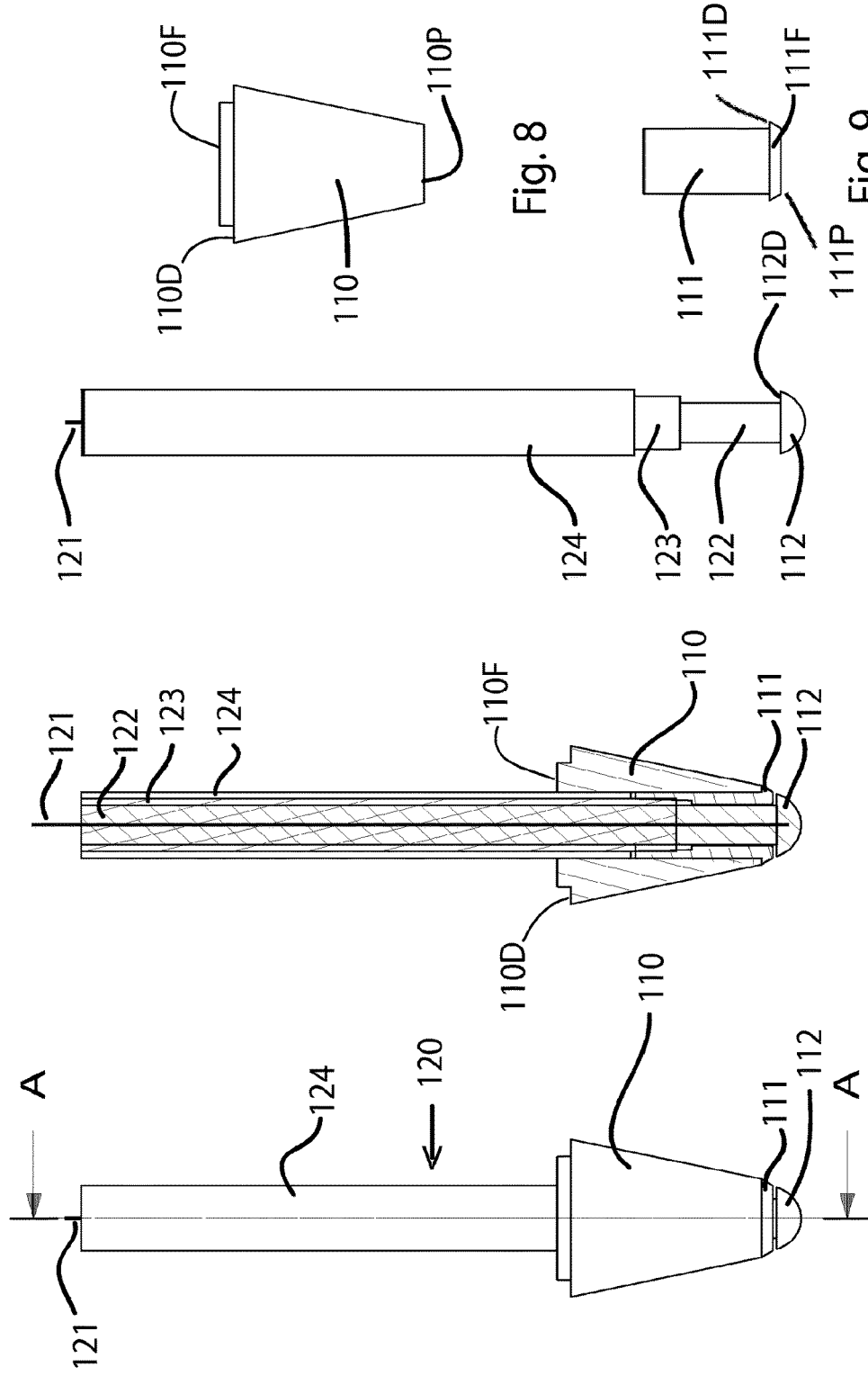

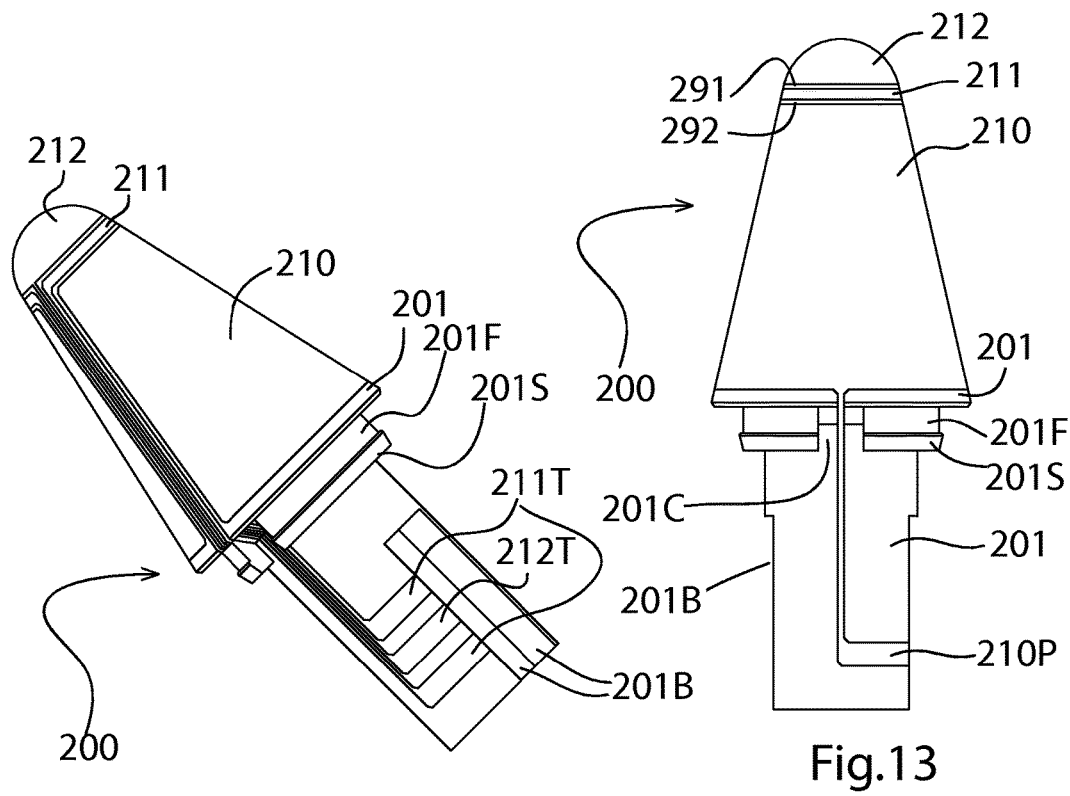
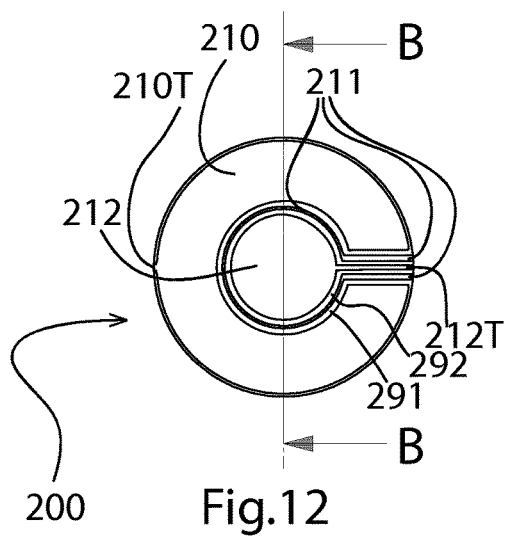
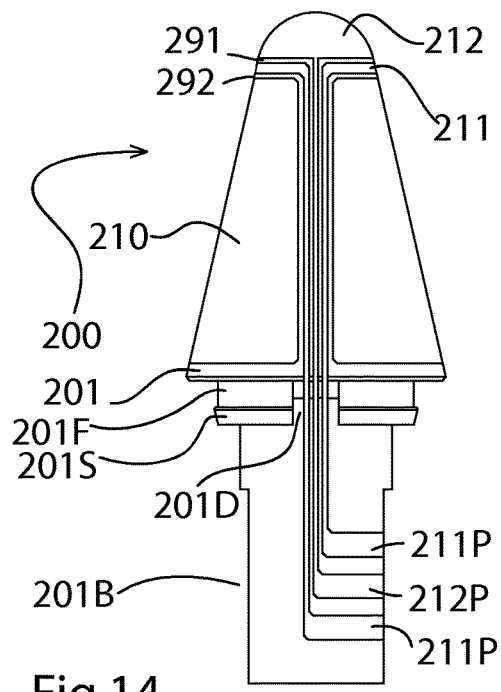

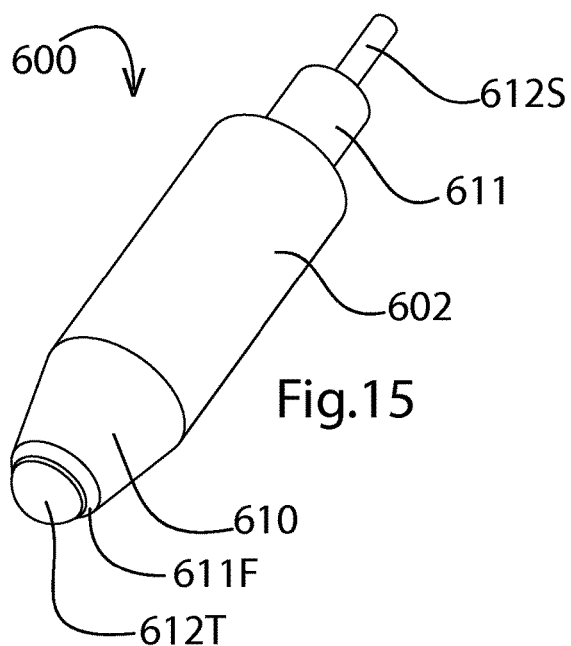
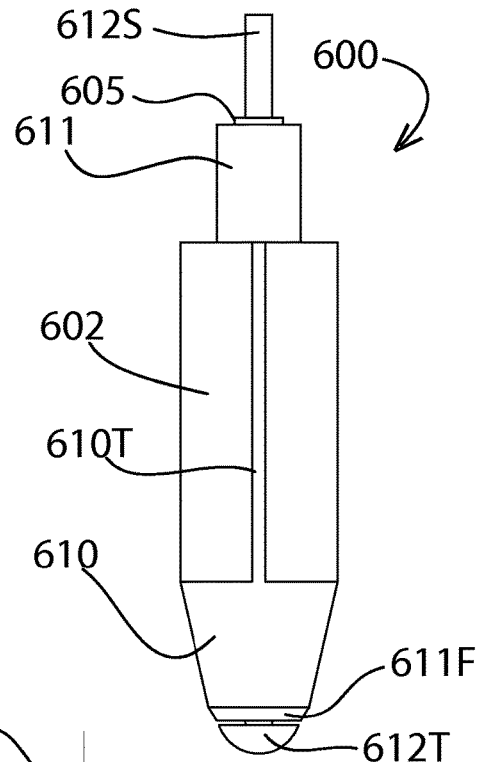
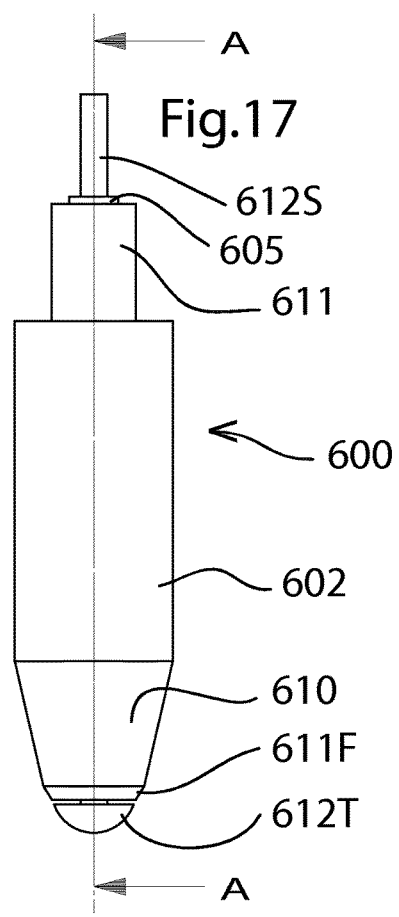
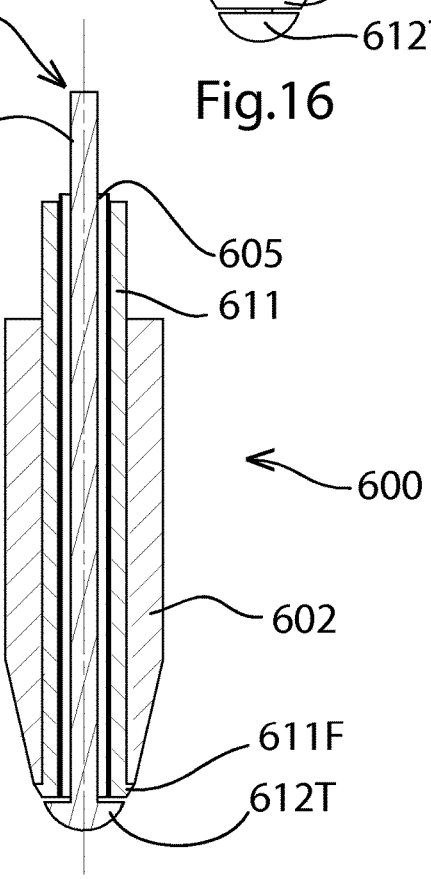

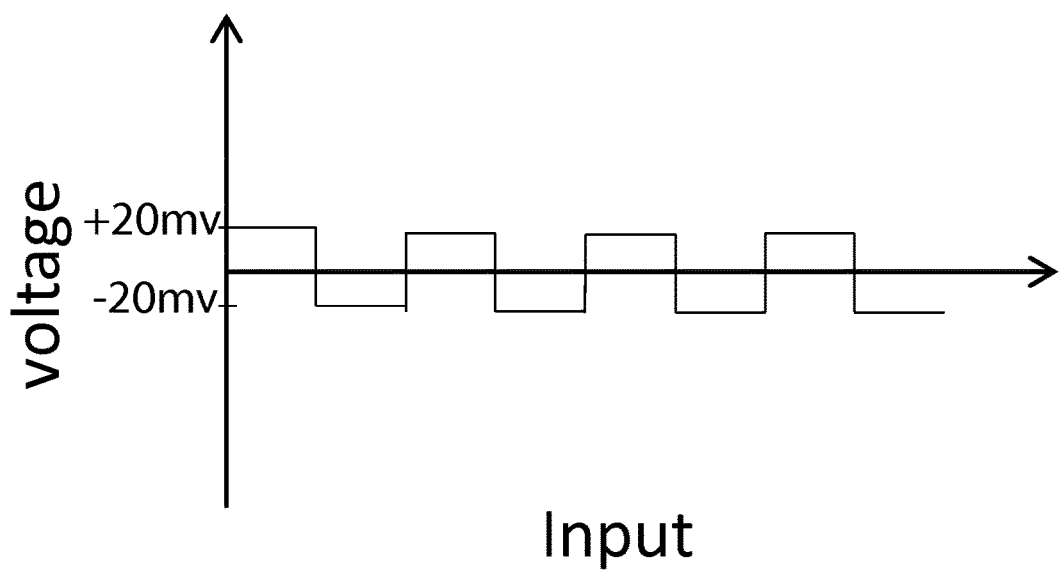
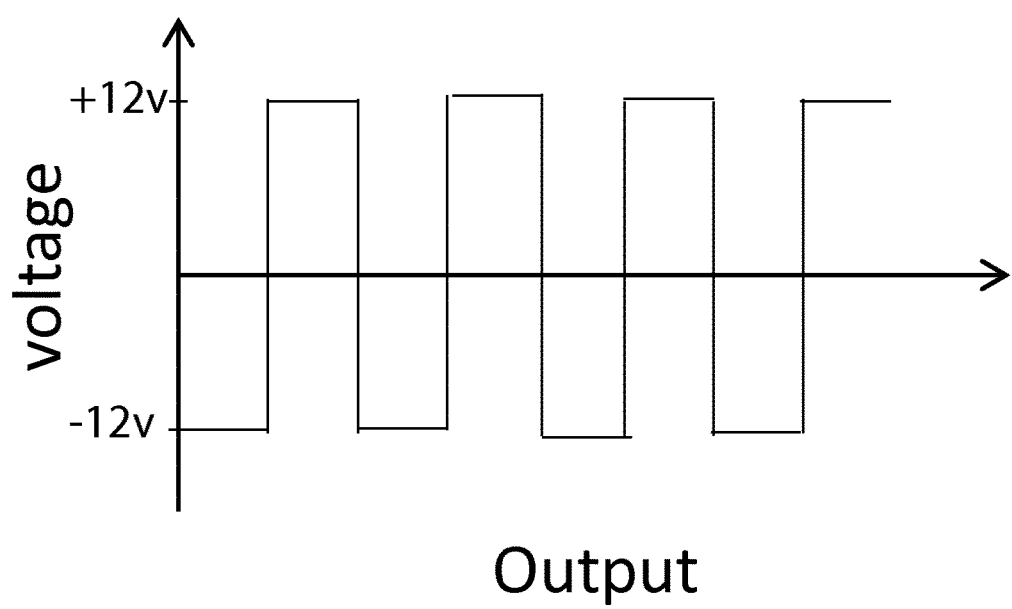
Fig.21

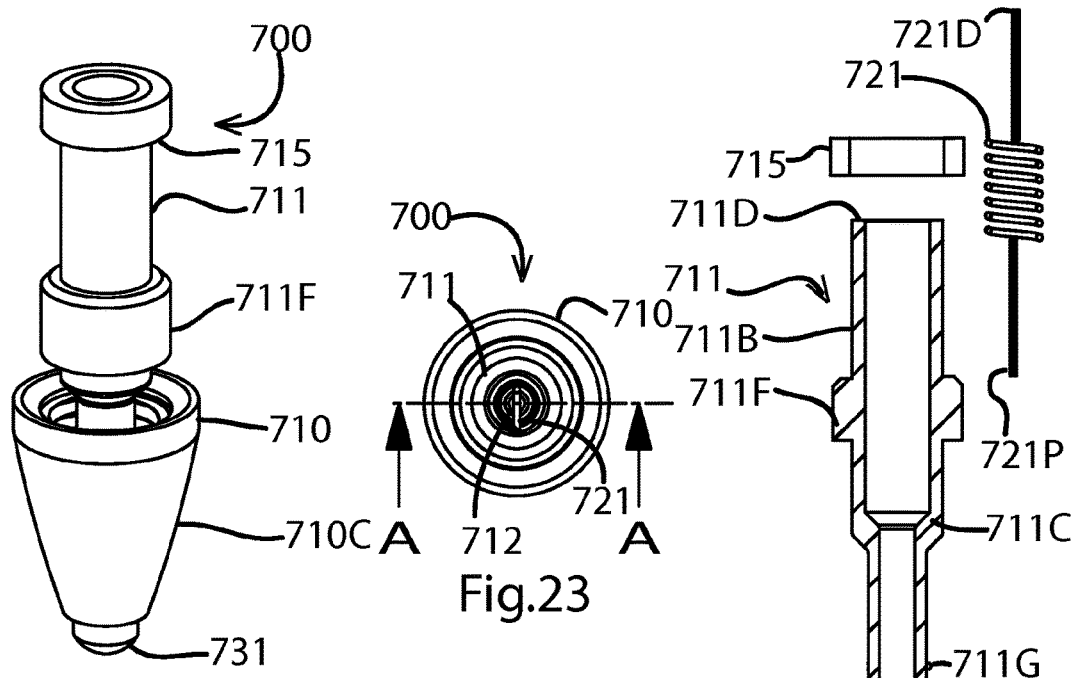
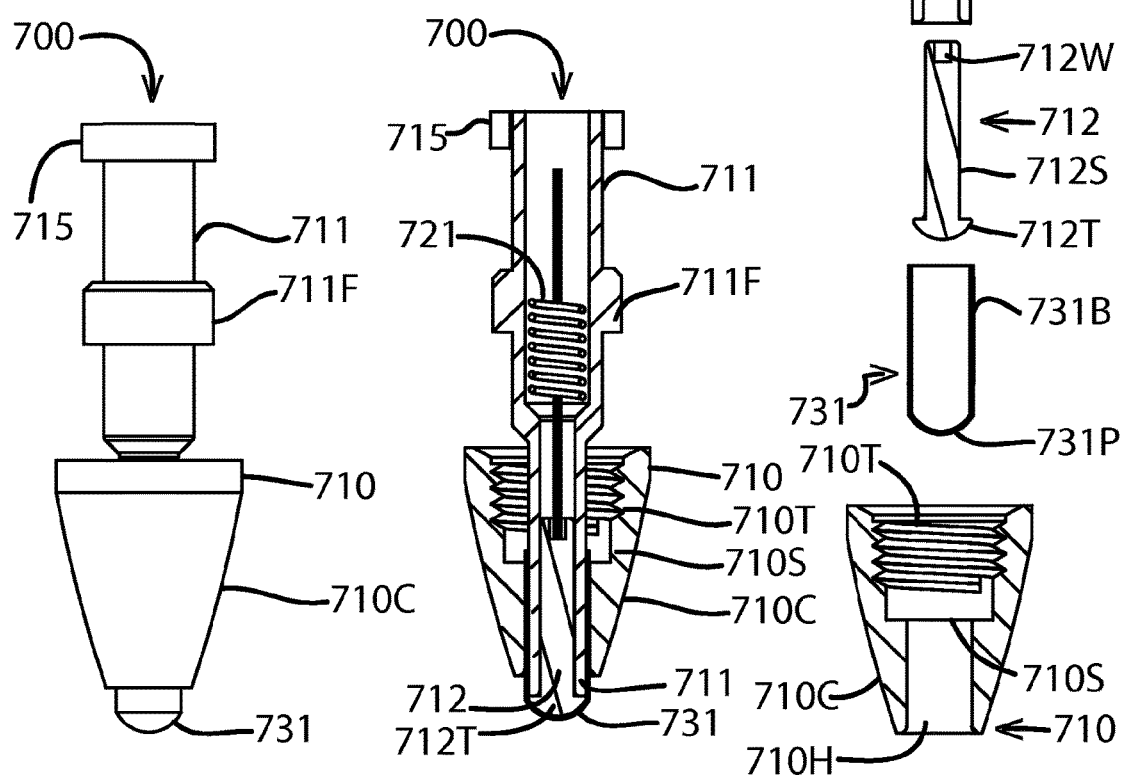
Fig.22  Fig.23
Fig.24  Fig.25  Fig.26

STYLUS FOR CAPACITIVE TOUCHSCREEN

CROSS-REFERENCE TO RELATED APPLICATIONS

This application is a U.S. National Stage submission under 35 U.S.C 371 of PCT Application No. PCT/US2014/017004, filed Feb. 18, 2014, which claims the benefit of and priority to U.S. provisional patent application No. 61/765,788, filed Feb. 17, 2013, and U.S. provisional patent application No. 61/882,159, filed Sep. 25, 2013.

BACKGROUND OF THE INVENTION

This disclosure relates to a stylus for use with a capacitive touchscreen, and more specifically to a stylus using active electronics to interact with a capacitive touchscreen.

SUMMARY OF THE PRIOR ART

Styluses for use with capacitive touchscreens are known in the art. Most such styluses are passive, having a wide conductive tip that is electrically coupled to the stylus body, such that when the body is gripped by a user, the user is electrically coupled to the tip. This allows the capacitance of the user's body to be sensed by the touchscreen across a large enough area to simulate a fingertip touch. Touchscreens on many of the most popular devices today require such large touches and capacitances in order to function; contacts by smaller capacitances or across smaller contact regions are ignored by the devices' firmware in order to reject capacitive noise, thereby helping to lower complexity and cost.

Precisely locating and "touching" points on a screen is aided by having a stylus with a small, non-deforming tip. Not only does a small tip allow the surrounding screen to be seen by the user, thereby helping the user to position the tip precisely, but also a non-deforming tip means that the firmware will have a consistent contact shape from which to determine the centroid.

Higher resolution touchscreens exist, but generally require a stylus that is specifically designed to interact with the given touchscreen so that the touchscreen can ignore other touches as noise. This eliminates the user's ability to use a fingertip to interact with the touchscreen, drastically reducing convenience and requiring that special hardware (the stylus) be developed and kept with the device.

Touchpad capacitive sensors are designed to require close proximity to avoid accidental touch detection, further limiting their capabilities. For example, custom hardware has been developed by some manufacturers that enables a stylus to be detected at some distance from the screen, thus allowing a touchscreen to display a cursor at an anticipated contact point. But this does not work for standard capacitive touchscreens which are designed to detect the capacitance of a user's fingertip; instead, special hardware for these touchscreens requires the use of a special stylus, thereby entirely preventing users from using their fingertips.

A stylus capable of interacting with a mutual capacitance touch device using a small, non-deformable tip is therefore desirable.

SUMMARY OF CERTAIN ASPECTS OF THE EMBODIMENTS

Embodiments are disclosed that use an amplifying electronic circuit, electrically coupled to a sensing electrode and an emitting electrode, to interact with a mutual-capacitance touchscreen circuit such that the touchscreen circuit and its firmware will detect what is treated as sufficient capacitance over a sufficient contact area to identify as a "touch".

The embodiments use an electrode set having a sensing electrode and an emitting electrode, both coupled to a circuit that detects the capacitive flux signal generated by an electronic device and inverts, amplifies, and re-emits the signal. The electrode set has a shielding layer between the sensing electrode and the emitting electrode to substantially reduce mutual capacitance, feedback, and signal crosstalk between the two electrodes. The amplified inverted signal causes reduced charging of the capacitors between the rows and columns close to the stylus in the touchscreen circuit, which causes a mutual-capacitance touchscreen circuit to detect sufficient capacitive coupling over a large enough region to cause its firmware to register a "touch". The circuit embodiments disclosed further amplify only those levels of the signal that are necessary to depress charging of the mutual capacitance circuit nearest the current touchpoint to avoid a "wavy line" effect.

BRIEF DESCRIPTION OF THE DRAWINGS

FIG. 6 is an orthogonal view of an anodized sensor/emitter tip assembly;

FIG. 7 is a cross-section view of an anodized sensor/emitter tip assembly along the plane of line A-A of FIG. 6 and through the longitudinal axis;

FIG. 8 is an orthogonal view of an emitting electrode for an anodized sensor/emitter tip assembly;

FIG. 9 is an orthogonal view of a shield for an anodized sensor/emitter tip assembly;

FIG. 10 is an orthogonal view of a sensing electrode attached to or formed on a coaxial cable for an anodized sensor/emitter tip assembly;

FIG. 11 is an orthogonal view from the tip end along the longitudinal axis of an embodiment of a tip formed by LDS for an active stylus;

FIG. 12 is a perspective view of an embodiment of a tip formed by LDS for an active stylus;

FIG. 13 is an orthogonal side view of an embodiment of a tip formed by LDS for an active stylus;

FIG. 14 is an orthogonal side view of an embodiment of a tip formed by LDS for an active stylus;

FIG. 15 is a perspective view of an embodiment of a hybrid LDS-and-anodized tip for an active stylus;

FIG. 16 is a side view of an embodiment of a hybrid LDS-and-anodized tip for an active stylus;

FIG. 17 is a side view of an embodiment of a hybrid LDS-and-anodized tip for an active stylus;

FIG. 18 is a cross-sectional view of an embodiment of a hybrid LDS-and-anodized tip for an active stylus along the line A-A of FIG. 17 and through the longitudinal axis of the tip;

FIG. 21 is a graph showing both an idealized input signal and an idealized output signal;

FIG. 22 is a perspective drawing of a force-sensing tip for an active stylus;

FIG. 23 is a top view of a force-sensing tip for an active stylus;

FIG. 24 is a side view of a force-sensing tip for an active stylus;

FIG. 25 is a cross-sectional view of a force-sensing tip for an active stylus along the plane A-A through the longitudinal axis of the force-sensing tip shown in FIG. 23;

FIG. 26 is an exploded view of the components of the force-sensing tip for an active stylus of FIG. 25.

DETAILED DESCRIPTION OF THE EMBODIMENTS

The following detailed description of embodiments references the accompanying drawings that form a part hereof, and in which are shown by way of illustration various illustrative embodiments through which the invention may be practiced. The embodiments are described in sufficient detail to enable those skilled in the art to practice the invention, and it is to be understood that other embodiments may be utilized and that logical changes may be made without departing from the spirit and scope of the invention. The detailed description is, therefore, not to be taken in a limiting sense, and the scope of the invention is defined solely by the appended claims.

Figures 1, 2, 30:
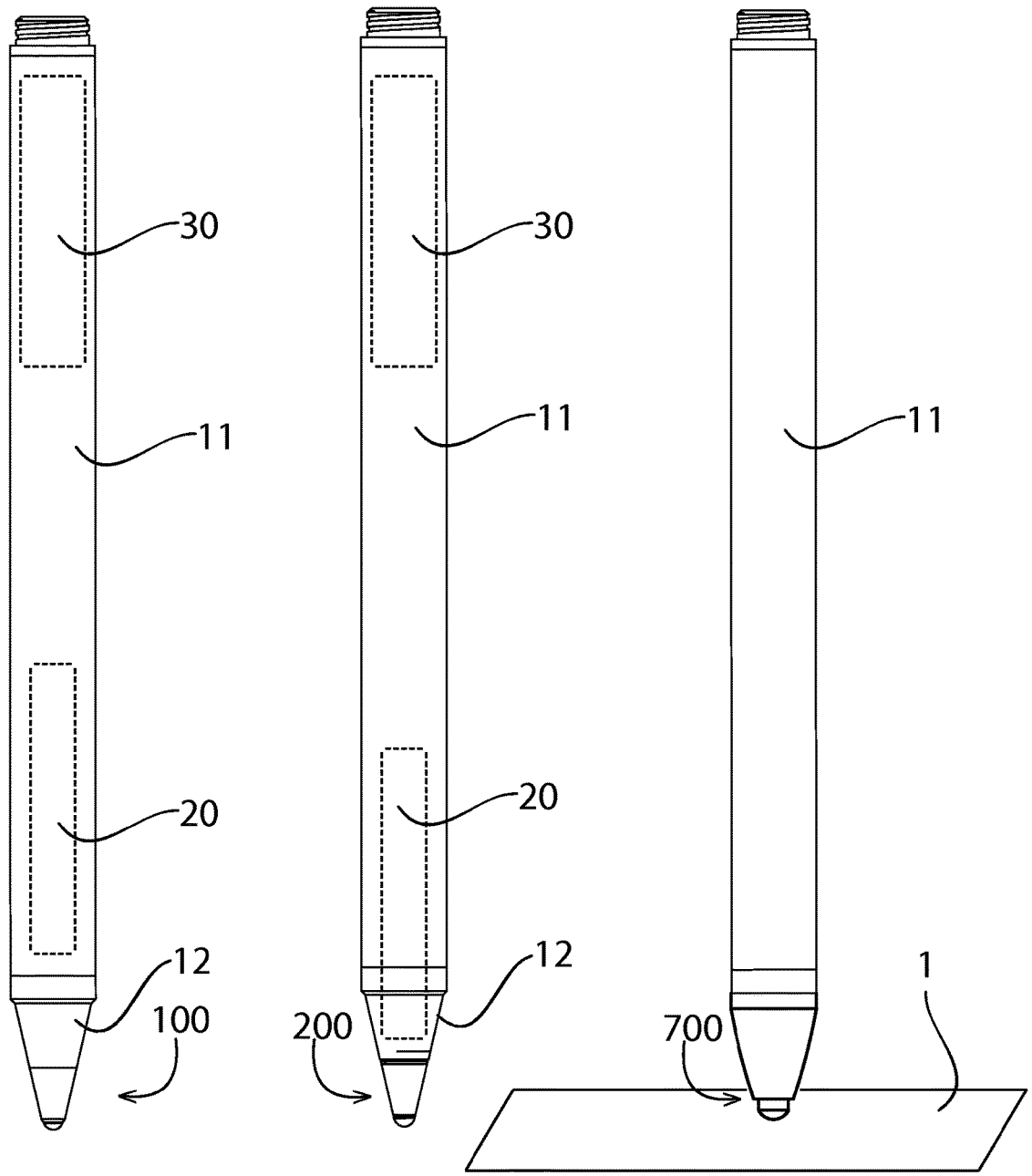
FIG. 1 is a drawing of a stylus with an embodiment of an anodized sensor/emitter tip assembly.
FIG. 2 is a drawing of a stylus with an embodiment of a laser direct structured ("LDS") sensor/emitter tip assembly.
FIG. 30 is a drawing of a stylus with a force-sensing tip assembly approaching a touchscreen.

Please refer to FIG. 1, an orthogonal view of an embodiment of an active stylus. Externally, the stylus 10 comprises a body 11, a fairing 12, and a tip 100. A printed circuit board 20 and battery 30 housed inside the body 11 are shown as dashed outlines; the printed circuit board 20 may comprise all circuitry necessary to implement the various electronic functions of the stylus, including a battery charger, power supply for the amplifier circuit, and the amplifier circuit itself. Unlike a passive capacitive stylus, in which a stylus body serves to electrically couple a conductive tip to the user's hand, an active stylus does not necessarily need do this, and so may be made of either conductive or nonconductive materials, or a combination thereof. Here, the body 11 of the stylus 10 serves to hold the tip 11 and to contain active electronic circuitry 20 and a battery 30 for powering the circuitry. FIG. 1 shows an embodiment of a tip 100 comprising an anodized sensor/emitter, as disclosed below (see FIG. 6 through FIG. 10 and related descriptions).

FIG. 2 shows an alternate arrangement of an embodiment of an active stylus using a tip 200 formed using laser direct structuring (LDS), as disclosed below (see FIG. 11 through FIG. 14 and related descriptions). The circuit board 20 is positioned such that an end of the circuit board 20 fits within a slot in the LDS tip 200, thereby allowing the leads (not shown) of the electrodes of the LDS tip 200 to be soldered directly to the appropriate pads (not shown) for electrically coupling the electrodes of the LDS tip 200 (see below) to the circuit board 20.

FIG. 30 shows an embodiment of an active stylus using a force-sensing tip 700 approaching a touchscreen 1.

Figure 19:
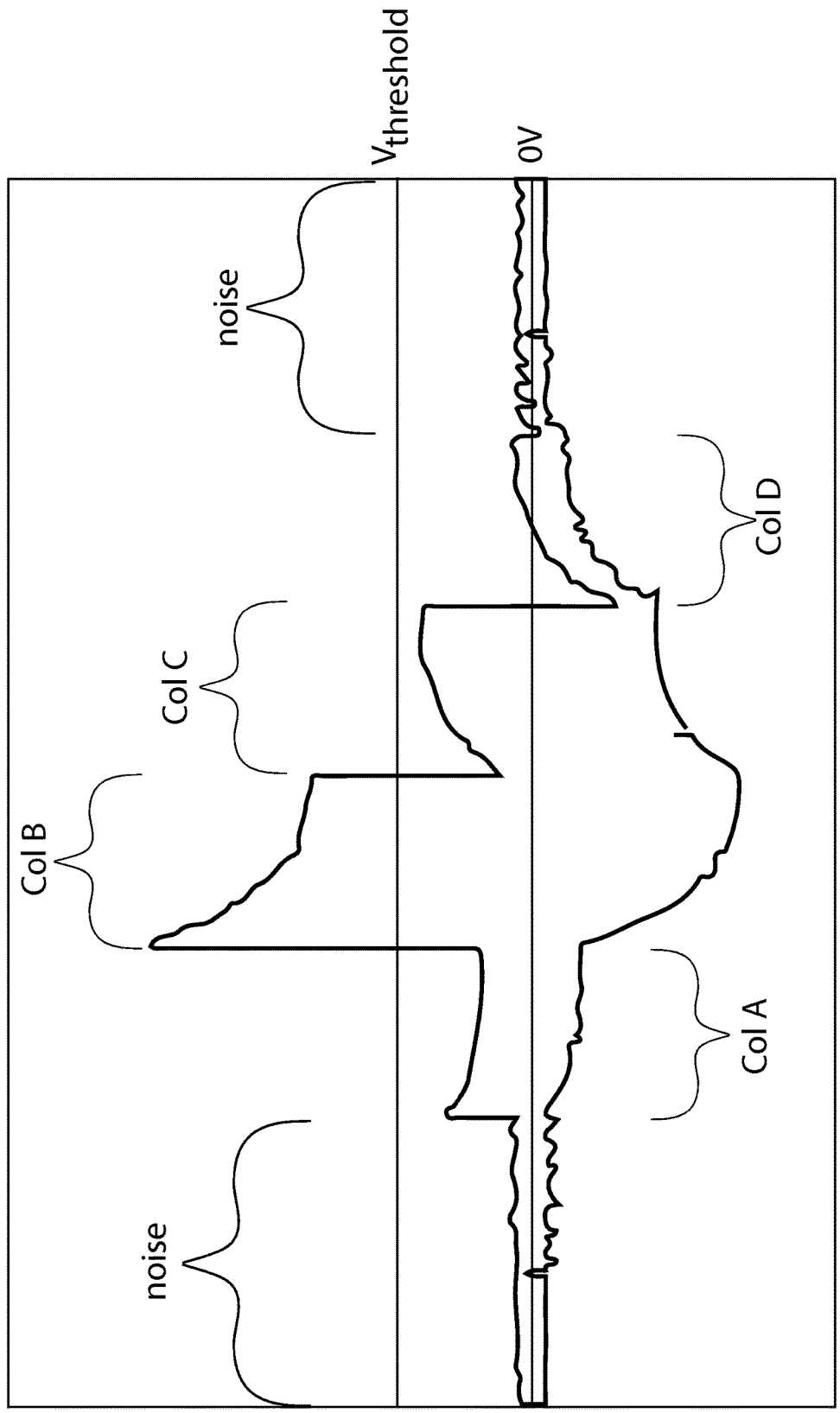
FIG. 19 is a graph of an oscilloscope trace of voltage detected at the surface of a capacitive touchscreen.

Please refer to FIG. 19, a graph showing the sequential scan of the column traces of a typical mutual-capacitance touchscreen and the capacitance generated between the touchscreen and the oscilloscope probe. An oscilloscope probe detects the column trace from four separate columns of the touchscreen. The detected voltages indicate that the probe is located between the second and third column, and is closer to the second column trace than to the third. To the far left, the oscilloscope probe detects only noise. In the segment labeled "Col A", a first ITO trace for a first column is energized, and capacitance between the probe and the touchscreen builds, eventually reaching an equilibrium. In the segment labeled "Col B", the second ITO trace for the second column is energized, and because the probe is closer to this trace, the detected voltage is significantly higher and the resulting mutual capacitance moves to equalize at a higher level, about four times the level of "Col A". Note that for "Col B", but not for the other columns or the noise, the voltage detected exceeds the input equivalent of the $V_{threshold}$ voltage described below. In the segment labeled "Col C", the third ITO trace corresponding to the third column is energized. The amount of energy received is only about twice as much as was received for "Col A", and so the curvature of the slope is negative, as the capacitance gradually stabilizes at a lower level. In the segment labeled "Col D", a fourth ITO trace corresponding to the fourth nearby column is energized. Only a small amount of voltage is detected by the probe, and the curvature is again negative. Subsequently, the detected voltage again reduces to the level of the noise from the system. The relative amounts of energy detected by the probe indicate that the oscilloscope's probe was located between Column B and Column C, and was closer to Column B.

Figure 20:
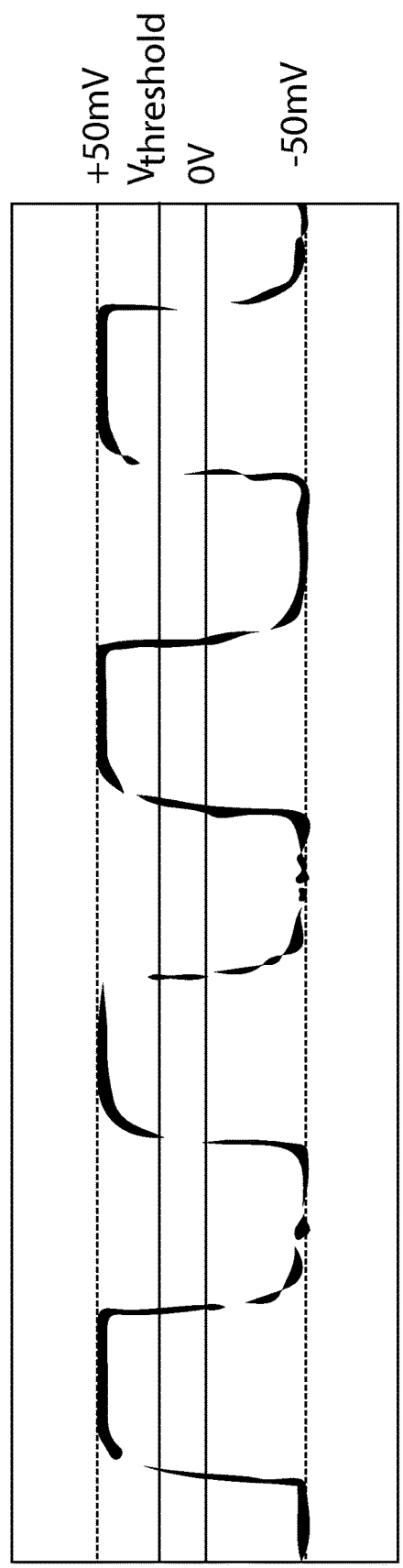
FIG. 20 is an expanded view of a segment of the graph of an oscilloscope trace of voltage detected at the surface of a capacitive touchscreen.

FIG. 20 shows an expanded view of a very short part of the waveform that energizes the touchscreen's traces. The output waveform as generated is square, but the leading edges show rounding due to the capacitive charging of the circuit. The detected voltage ranges from about +50 mV to −50 mV, and the detected frequency is about 294.1 kHz. Note that the voltage detected exceeds the input equivalent of $V_{threshold}$, as shown.

Please refer briefly to FIG. 21, a graph showing both an idealized signal from a prior-art touchscreen and the idealized resultant output signal of an embodiment of an active stylus. The idealized representation of the input waveform is representative of a short sample of one segment of the oscilloscope trace shown in FIG. 19. This expanded view of the input waveform shows a square wave of about 40 mV peak-to-peak (+−20 mV). The stylus detects this signal and responds by emitting an inverted amplified signal, the output waveform, also a square wave, of about 24V peak-to-peak (+−12V). An inverting amplifier circuit 300, 400, 500 takes the input voltage signal and outputs a function of that voltage signal, where the output voltage follows the following function (in C language syntax):

$$V_{out} = (V_{in} < V_{threshold} \; ?0: -K*V_{in})$$

where K is a large constant. When the detected voltage is below a threshold value, no voltage is output; when the detected voltage is at or above a threshold value, the voltage is inverted and amplified to the saturation limit of the circuit, resulting in a series of square-wave pulses. Alternately, this output voltage may be level-shifted so that both positive and negative voltage square wave components are output; the function followed is along the lines of:

$$V_{out}=(V_{in}<V_{threshold} ?K*V_{in}: -K*V_{in})$$

Because the input is a square wave, the output will likewise be a square wave, but inverted compared to the input signal, and at a significantly higher amplitude. The output signal frequency is inherently matched to the input signal frequency by the amplifier. Embodiments of the circuit may amplify the signal by a factor (K) of about 600 to 1500, resulting in an input signal having a threshold voltage of 20 mV being amplified to between 12V to 30V depending on the requirements of a particular implementation. Please note that the actual threshold-setting circuit may be implemented at any stage of the amplifier, but in the embodiments as shown it has been put in the final stage driver circuit. The input signal thus may be amplified and shifted repeatedly before an intermediate signal is compared against $V_{threshold}$; the input equivalent of $V_{threshold}$ may thus be significantly different from the $V_{threshold}$ that the intermediate signal is compared to within the circuit.

Figure 3:
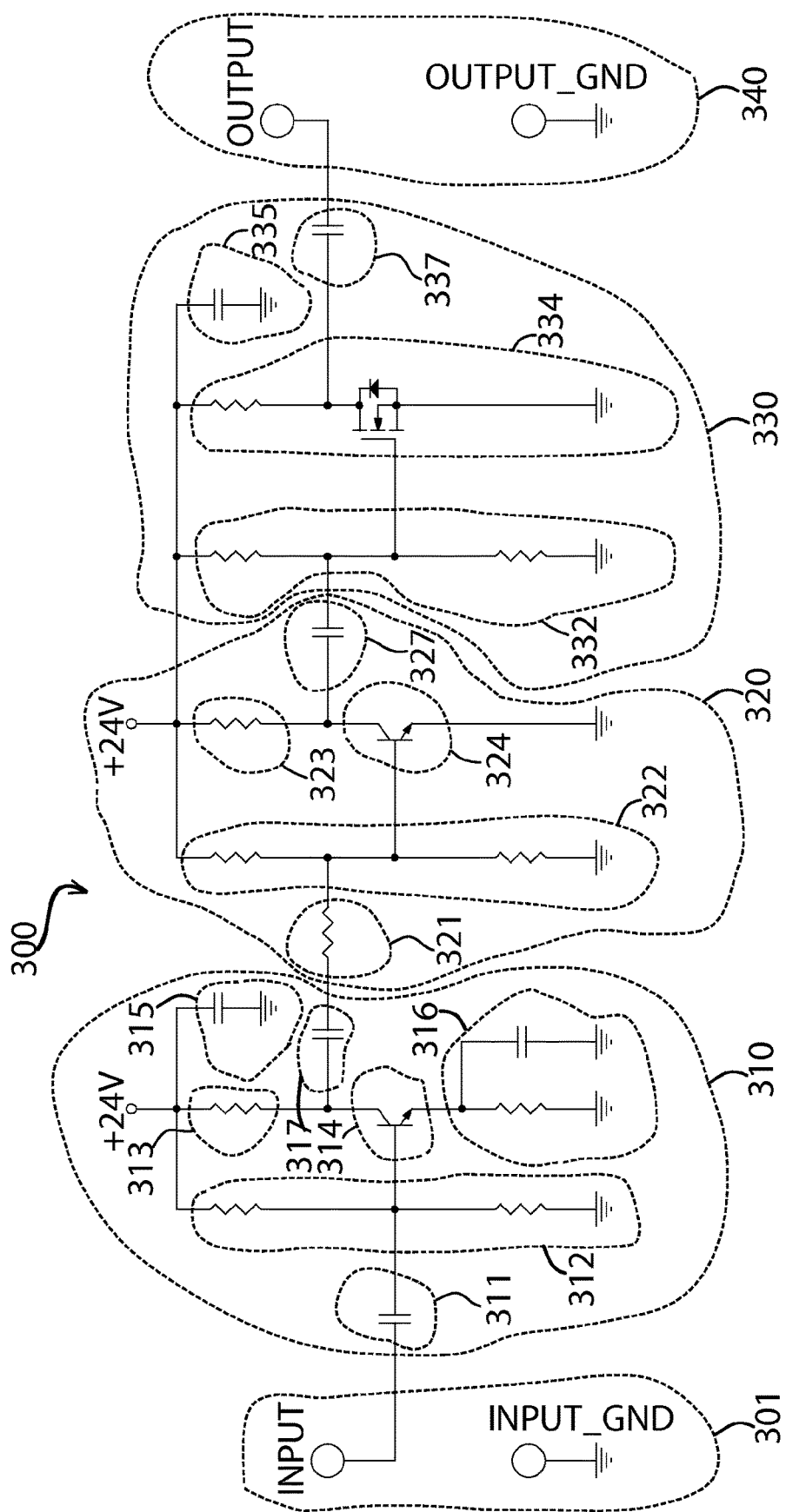
FIG. 3 is a circuit diagram of an inverter-amplifier using transistors.

Referring now to FIG. 3, a circuit diagram showing an embodiment of the electronic circuit for an active stylus using transistors, the inverting amplifier circuit 300 has sensor connection block 301, first-stage amplifier 310, second stage amplifier 320, driver 330 and emitter coupling block 340.

The signal level output by the circuit may be in the range of from 18V to 30V. Below 18V, common capacitive touch-screens such as those on the Apple® iPad® may not be sufficiently affected to cause them to detect a touch, while above 30V the signal may cross-couple between the sensing electrode and emitting electrode, resulting in feedback, in addition to this causing excessive and unnecessary power use.

Focusing on the first-stage amplifier 310 of the circuit diagram of FIG. 3, a sensing electrode, such as sensing electrode 112 of FIGS. 6-10 or sensing electrode 212 of FIGS. 11-14, is electrically coupled to a low frequency cancellation capacitor 311, which eliminates low frequency noise such as electrical hum that might otherwise be overlaid upon the desired signal. Power to the circuit is supplied through a level shift resistor pair 312 and an output power resistor 313; the level shift resistor pair 312 serves to pull up the signal from a typical input level of 0V±20 mV to a level of 0.5V±20 mV. A power noise filtering capacitor 315 tied to the input power helps to eliminate noise generated by the power supply circuit (not shown). This level-shifted signal is fed into an amplifying transistor 314, which inverts and amplifies the signal in conjunction with a further boost from the emitter bypass subcircuit 316 to about 0.5V±400 mV. The inverted and amplified signal is output from the inverter-amplifier block through a filtering capacitor 317 to again filter out low-frequency noise.

Input into the second stage amplifier 320 of the circuit diagram of FIG. 3 is supplied through a current-limiting resistor 321, which feeds into the second stage amplifier 320. The second-stage amplifier 320 comprises a level shifting resistor pair 322, a power supply resistor 323, and an inverting amplifier transistor 324. Input power to the power supply resistor 323 is coupled to filter capacitor 335 to filter out noise from the power supply. Output is filtered by capacitor 327 to remove low-frequency noise, and feeds into the driver circuit 330. The second stage amplifier 320 amplifies the signal to about the range of 0-3 volts peak-to-peak.

The driver circuit 330 uses a level setting resistor pair 332 to eliminate signals below a threshold voltage level $V_{threshold}$; by selecting an appropriate level below which the inverted and amplified signal is eliminated, the output signal is emitted only when a signal from a nearby trace is detected, and so capacitive charging is suppressed only when appropriate. Failure to so limit the output signal results in a "wavy line problem", wherein suppression is performed for other columns in addition to the nearest, causing the capacitive sensor to sense a touch across a wide area, which in turn results in the touch circuit hardware and firmware sending incorrect position data in touch events; the end result is that if a user attempts, for example, to draw a line across the screen, the line is not straight, but rather follows a wavy or sinusoidal path. Although the level setting resistor pair 332 is optional, it provides significant benefit to the circuit and to the end user by eliminating the wavy line problem through an extremely simple hardware solution rather than a complex software method or mixed hardware-software means. After filtering and level-setting, the signal is fed into the driver subcircuit 334, which amplifies and inverts the signal a third time; power to the driver subcircuit 334 is noise-filtered by coupling the power through filter capacitor 335. This may be done to a relatively high voltage level of between +18V to +30V by using a MOSFET, chosen for its power-handling capacity. Output from the circuit may be electrically coupled to an emitting electrode through an optional filter capacitor 337 to level-shift the signal and/or eliminate low-level noise; the emitting electrode may be for example emitting electrode 110 of tip 100 or emitting electrode 210 of tip 200 or emitting electrode 610 of tip 600.

It should be noted that although not shown in the circuit diagram, the shield 111 or shield 211 is coupled to ground.

Figure 4:
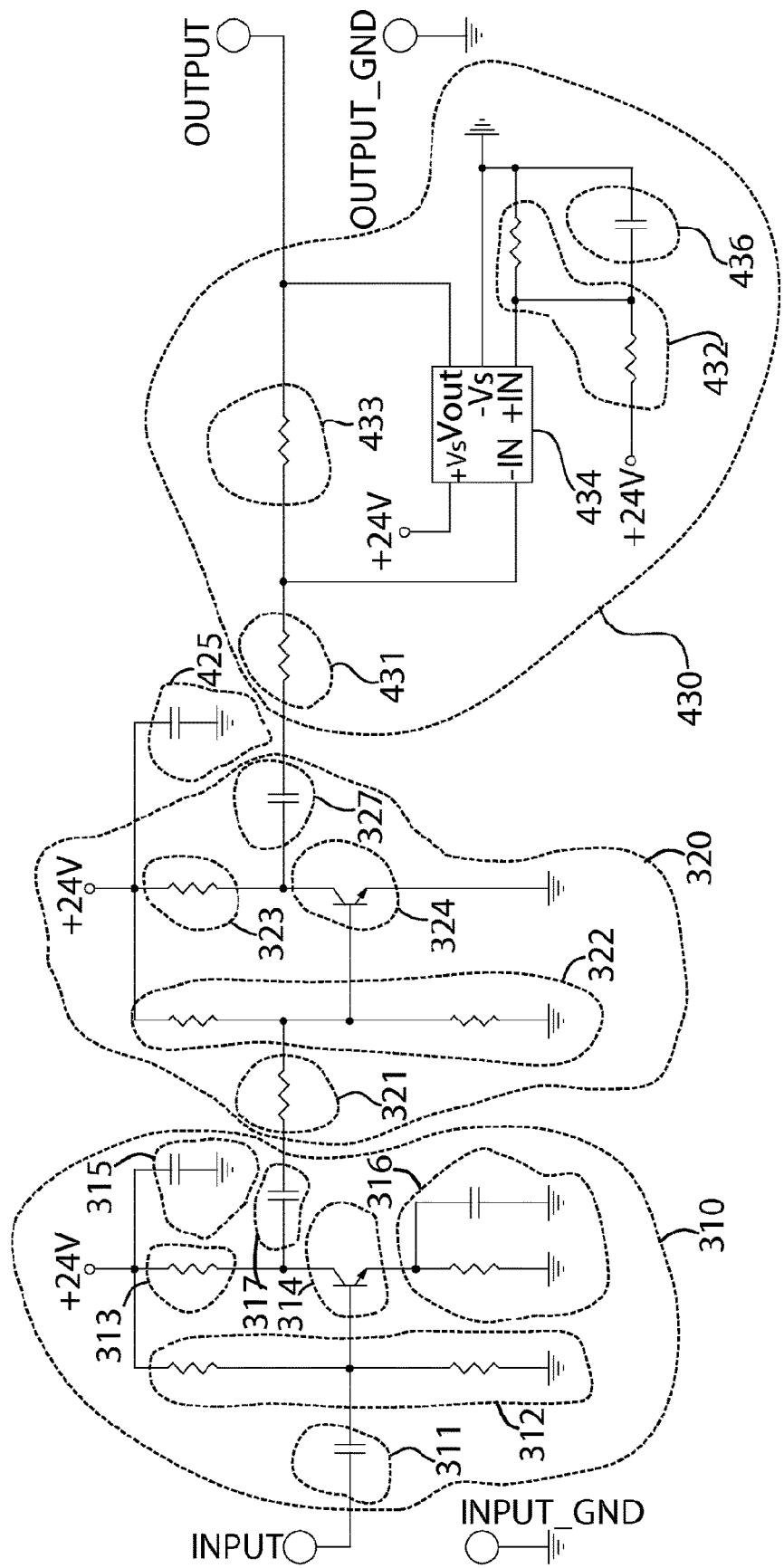
FIG. 4 is a circuit diagram of an inverter-amplifier using transistors and having an op-amp final stage.

Referring now to FIG. 4, a circuit diagram showing an embodiment of the electronic circuit for an active stylus using an op-amp for the driver circuit, the inverting amplifier circuit 400 comprises a sensor connection block 301, first-stage amplifier 310, second-stage amplifier 320, op-amp driver circuit 430, and emitter coupling block 340. By adjusting level shifting resistor pair 322 of the amplifier block 320, and replacing driver circuit 330 with a more efficient op-amp driver circuit 430, the inverting amplifier circuit 400 has significantly lower power consumption. To have sufficient output power while nevertheless maintaining high efficiency, an operational amplifier (or "op amp") is used in the op-amp driver circuit 430. A high-gain high-bandwidth amplifier quickly responds to changes in signal level; for example, an op amp with about 50 MHz bandwidth or response time is suitable for use. The first-stage amplifier 310 and second-stage amplifier 320 are used to feed an amplified signal to op-amp driver circuit 430 through current-limiting resistor 431. Power supply to the second-stage amplifier 320 is noise-filtered by coupling it to filter capacitor 425. Level shifting resistor pair 322, power supply resistor 323, and current-limiting resistor 431 are selected to deliver voltage to the inverting input of the op-amp 434 that will be just within the input limits of the op-amp 434. The op-amp driver circuit 430 takes as input the output of the second-stage amplifier 320, at about 3V, and amplifies it to a level sufficient to act upon a capacitive touch sensor. A voltage divider resistor pair 432, in concert with filter capacitor 436, is used to supply a clean, filtered voltage to the non-inverting input of the op-amp 434; this voltage is the threshold voltage $V_{threshold}$, below which the input signal will be clipped. The threshold voltage in this embodiment may be calculated as:

$$V_{threshold}=V_{ps}*R21/(R22+R21)$$

or more generally as the power supply voltage, in this example circuit shown as +24V, times the resistance of the resistor coupled to ground and divided by the sum of the resistances of both resistors. By supplying a fixed positive voltage to the non-inverting input, and the signal voltage to the inverting input, the circuit is inverting. Output is fed back through feedback resistor 433 to stabilize the circuit. The signal output from op-amp 434 is electrically coupled to an emitting electrode such as emitting electrode 110 of tip 100 or emitting electrode 210 of tip 200 or emitting electrode 610 of tip 600.

Figure 5:
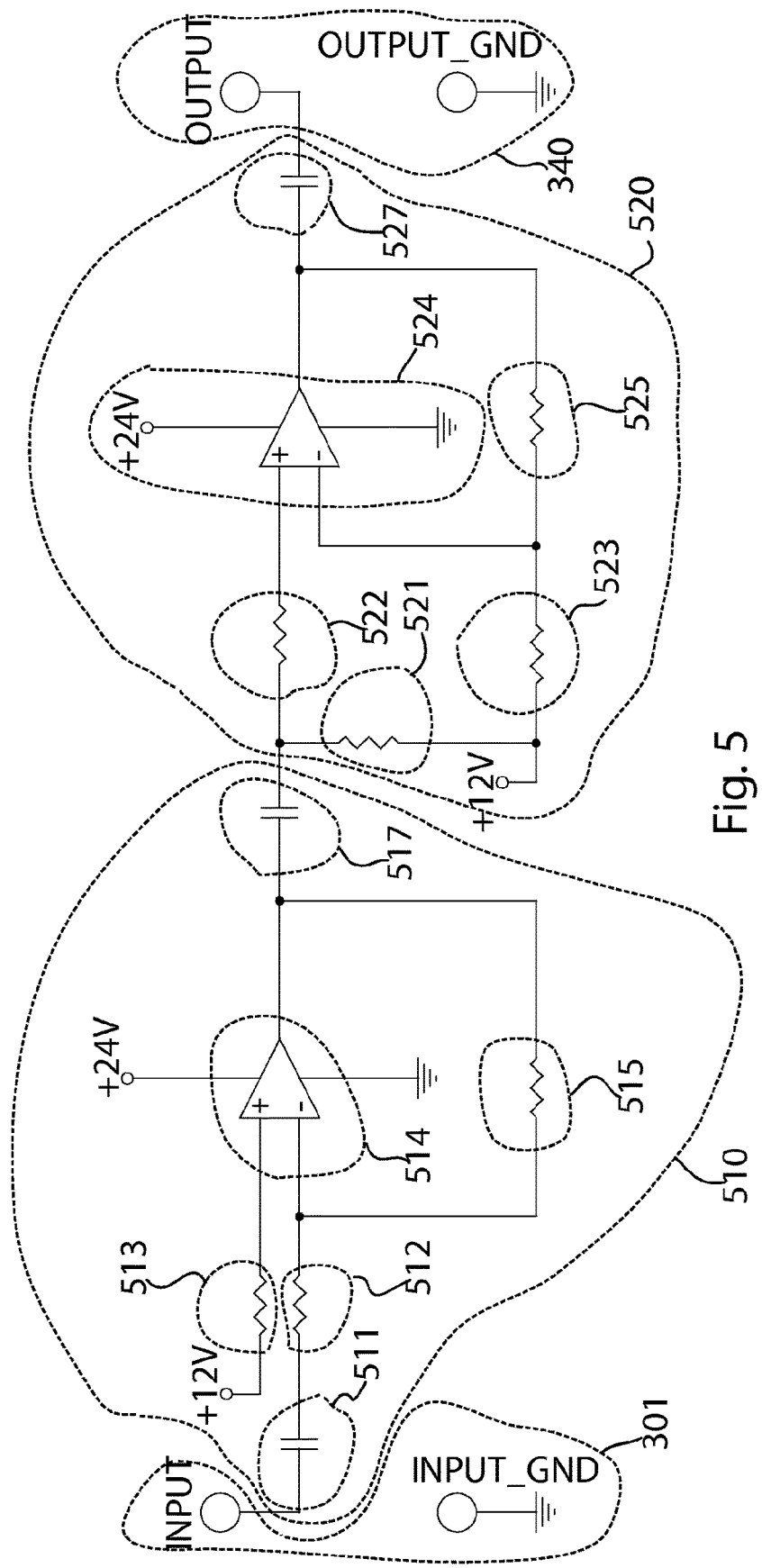
FIG. 5 is a circuit diagram of an inverter-amplifier using op-amps.

Referring now to FIG. 5, an inverting amplifier circuit 500 using two op-amp stages, the circuit 500 comprises a sensing electrode connection block 301, a first stage inverting amplifier 510, a second stage non-inverting driver 520, and an emitter coupling block 340. Input differential is electrically coupled to the first op-amp 514 through current limiting resistor 513. Input signal is electrically coupled to the first op-amp 514 through filter capacitor 511 and level-setting resistor 512. Feedback to stabilize the circuit is provided by coupling the op-amp output back to the signal input via feedback resistor 515. Amplifying input power and ground are directly electrically coupled to the op-amp terminals. The output of the first op-amp 514 is inverted and amplified from input levels to a level sufficient to drive the second stage non-inverting driver 520; the output from the first stage inverting amplifier 510 is electrically coupled to the second stage non-inverting driver 520 through output filter capacitor 517 to cancel noise. The amplification of the circuit is described by the function:

$$V_{out}=-K*V_{in}*R_{feedback}/R_{level}$$

where $R_{feedback}$ is set by feedback resistor 515 and $R_{level}$ is set by level-setting resistor 512, and K is a constant. In an example embodiment, an input voltage level was amplified from about 20 mV to about −3V, for a K of about 150.

Input to the second stage non-inverting driver 520, through filter capacitor 517, may optionally be coupled through a current-limiting resistor (not shown).

The input signal is coupled to the non-inverting input of the driver op-amp 524 through current limiting resistor 522. The input signal is also coupled to the inverting input of the driver op-amp 524 through impedance matching resistor 521, which along with input power is coupled to the inverting input of the driver op amp through power input resistor 523. The driver op-amp 524 has its power terminals tied to the power supply voltage, in this example embodiment 24V, and ground respectively. Output from the driver op-amp 524 is coupled to the inverting input of driver op-amp 524 via feedback resistor 525, and also to the emitter coupling block 340 either directly or optionally via a filter capacitor 527. Without the filter capacitor 527, output may be from 0V to +24V; with the filter capacitor 527, output may be shifted to +−12V (24V peak-to-peak). The output voltage of the driver circuit 520 may be between 18V to 30V, and may be approximated by the function:

$$V_{output}=(1+(R_{feedback}/R_{power}))*V_{input}$$

where $V_{input}$ is the voltage measured after the filter capacitor 517 of the first-stage inverting amplifier 510. The threshold voltage $V_{threshold}$ is set by the choice of values for the impedance matching resistor 521, power supply resistor 523, and feedback resistor 525.

Referring now to FIG. 6, an orthogonal view of an embodiment of an anodized sensor/emitter tip, in combination with FIG. 7, a cross-section view of an embodiment of a tip for an active stylus, the tip 100 comprises two electrodes, an emitting electrode 110 and a sensing electrode 112, separated by a shielding layer 111. The tip 100 may be substantially radially symmetrical around its longitudinal axis; in particular, the two electrodes and the shielding layer may be symmetrical around their respective longitudinal axes (which are congruent to the longitudinal axis of the tip 100 itself when assembled) in order to present a consistent capacitive signature to a touchscreen regardless of the rotational orientation at which the stylus is held during use. All three layers 110, 111, 112 are conductive, and so must be electrically insulated from each other. Some embodiments may use a pair of electrically insulating layers (not shown), for example of a nonconductive polymer, one between the shield 111 and the emitting electrode 110, and one between the shield 111 and the sensing electrode 112, to electrically isolate the three layers. Other embodiments may anodize one, two, or all three layers 110, 111, 112 so that the anodizing serves as electrical insulation, thereby eliminating the additional layers. One way of doing this is to anodize at least the shield 111 with a layer of anodizing (aluminum oxide) sufficient to prevent electrical conductivity between the layers; the emitting electrode 110 and sensing electrode 112 may optionally also be anodized. Alternately, the emitting electrode 110 and sensing electrode 112 are anodized, in which case the shield 111 may optionally also be anodized. Anodizing serves as insulation when sufficiently thick; a layer of anodizing (Type II or Type III) of thickness 0.0002 inches or greater is sufficient for the voltages involved.

As shown in FIG. 8, FIG. 9, and FIG. 10, the emitting electrode 110 has an internal flange 110F, a distal surface 110D and a proximal edge 110P, wherein the internal flange 110F extends radially outward from the distal surface 110D and the proximal edge 110P is opposite to the distal surface 110D and the shield 111 has an external flange 111F having an external flange distal surface 111D and external flange proximal surface 111P at the proximal end of the shield 111, wherein the external flange 111F is located between and therefore electrically isolates the proximal edge 110P of the emitting electrode 110 from a distal face 112D of the sensing electrode 112.

Referring again to FIG. 11, the sensing electrode 112 is formed of a conductive material such as a metal or metal alloy, conductive polymer, or conductive shell formed over a polymer. The proximal surface 112P of the sensing tip 112 may be in the form of a spherical cap, paraboloid, one sheet of a hyperboloid of two sheets, or similar smoothly curved surface. In some embodiments, the sensing tip 112 is electrically connected to the center conductor 121 of a coaxial cable 120; the sensing tip 112 may be set closely against the dielectric 122. In some embodiments, the sensing electrode 112 is formed of solder that is melted onto the center conductor 121 of the coaxial cable 120 and is then molded into an appropriate shape as listed above; in other embodiments, the sensing electrode is formed of a conductive metal such as copper, aluminum, steel, etc., and then soldered, brazed, welded, press-fitted, staked, or otherwise electrically and mechanically connected to the center conductor 121. The shielding conductor 123 (which may be braided, foil, or both) of the coaxial cable 120 is electrically connected to the shielding layer 111 to extend the shielding layer at least past the emitting electrode 110 and in some embodiments to substantially near the PCB (not shown). The shielding layer 111 may have an outer diameter substantially similar to the outer diameter of the coaxial cable 120, and an inner diameter substantially similar to the outer diameter of the coaxial cable's dielectric layer 122. The emitting electrode 110 has a central axis hole of substantially the same diameter as the coaxial cable 120, thereby allowing the emitting electrode 110 to slide over the outer sheath 124 of the coaxial cable 120. The center conductor 121 of the coaxial cable 120 is electrically coupled to the printed circuit board (not shown), the shielding conductor 123 of the coaxial cable 120 is electrically coupled to ground on the printed circuit board (not shown), and the emitting electrode 110 is electrically coupled to the printed circuit board (not shown) with a wire (not shown).

Referring to FIG. 8 in combination with FIG. 7, the emitting electrode 110 may be a right circular conical frustum having a cylindrical hole, axially aligned with the axis of the conic frustum and of a size to fit closely around the coaxial cable 120 and the shield 111, through the center. An optional internal flange 110F at the distal end may be used to align and stabilize the emitting electrode 110 in the fairing 12 when assembled.

Referring now to FIG. 9 in combination with FIG. 7, the shield 111 may be a hollow cylinder having an external flange 111F on one end, the external flange 111F being wide enough to electrically isolate the emitting electrode 110 from the sensing electrode 112, for example by having its widest diameter be as wide as the proximal end of the emitting electrode 110. The shield 111 is formed of a conductive material, and in some embodiments is anodized aluminum. The shield 111 has a first segment in which the central hole is of a diameter to admit the dielectric 122 of the coaxial cable 120, and a second segment in which the central hole is of a diameter to admit the shielding layer 123 of the coaxial cable. The shield 111 is electrically coupled to the shielding layer 123 of the coaxial cable 120.

To assemble the anodized tip 100, the coaxial cable may have its outer insulating layer 124 stripped, a lower portion of the shielding layer 123 stripped, and a short segment of the dielectric 122 removed, leaving a short segment of the center conductor 121 exposed. The shield 111 may then be slipped over the end of the coaxial cable 120 until the distal end of the shield 111 abuts the insulating layer 124 of the coaxial cable 120, and the shielding layer 123 may then be electrically coupled to the shield 111. The sensing tip 112 may then be attached to or formed upon the center conductor 121 such that the sensing tip's distal face 112D abuts the external flange proximal surface 111P of the external flange 111F of the shield 111. The emitting electrode 110 may then be slid down over the coaxial cable 120 to rest on the shield 111 such that the proximal edge 110P of the emitting electrode 110 abuts the external flange distal surface 111D of the external flange 111F. The coaxial cable 120 may then be slid into the fairing 12 until the distal surface 110D of the emitting electrode 110 abuts the fairing 12 and the internal flange 110F rests inside a receiving portion of the fairing 12. The center conductor 121 may then be connected to the sensing electrode pad (not shown) on the PCB (not shown), the shielding layer 122 may be connected to ground (not shown) on the PCB (not shown), and the emitting electrode 110 may be connected to the emitting electrode pad (not shown) on the PCB (not shown) using, for example, a wire (not shown).

Another embodiment of a stylus probe uses laser direct structuring (LDS) to form metallized tracks on a polymer substrate. Refer to FIG. 11, a perspective view of an embodiment of a probe for an active stylus, in combination with FIG. 12, a top view of said probe, FIG. 13, a side view of said probe from the left of line B-B of FIG. 12, and FIG. 14, a side view of said probe from the right of line B-B of FIG. 12. The probe substrate is injection-molded, its surface is laser etched along the paths and regions that will form the electrodes and their conductive paths, and electrodes are electrolessly plated onto the substrate along the laser-etched regions. The probe 200 has a body 201 formed of a polymer suitable for use with the LDS process. The body is a thin polymer shell, for example a conical frustum of a right circular cone capped by a spherical cap such that a vector tangent to the edge of the spherical cap is congruent to a vector lying in a surface of the frustum. The body 201 may have a flange 201F with a snap 201S for attachment into a fairing 12, with the flange 201F serving to align and stabilize the tip 200 in the fairing 12 when assembled. A slot 201B in the distal end of the body 201 acts as a receiving point into which a PCB (not shown) may be inserted so that the pads 210P, 211P, 212P of the electrodes can be soldered directly to the PCB. An emitting electrode 210 and emitting electrode trace 210T ending in an emitting electrode pad 210P, a shielding trace 211 and shielding trace pads 211P (one on each end of the shielding trace 211), and a sensing electrode 212 and sensing electrode trace 212T ending in a sensing electrode pad 212P are then formed onto the body 201. Nonconductive traces 291, 292 prevent electrical conductivity between the three traces, while the shielding trace 211 lies between and capacitively isolates the emitting electrode 210 from the sensing electrode 212 and sensing electrode trace 212T; the emitting electrode trace 210T is positioned so that it is effectively isolated from the other traces by distance. The emitting electrode trace 210T is routed along a body cutout 201C, and the shielding trace 211 and sensing electrode trace 212T are routed along a body cutout 201D, to provide physical space so that they do not rub against the fairing 12 when assembled, which could otherwise result in wear damage to the traces. Capacitive isolation may optionally be further increased by the use of a metallized insert (not shown) placed within the shell and electrically coupled to ground.

An optional protective cover (not shown) may be used to cover the body 201 to prevent wear to the electrodes, in particular the sensing electrode 212, that might otherwise be caused by ordinary use, such as by rubbing the tip 200 against a capacitive touch device's surface. The protective cover may be made user-replaceable so that when the protective cover wears down, it can be readily swapped for a new one by the user, thus extending the lifespan of the tip 200 and hence the stylus. Alternately or additionally, the tip 200 may optionally be made user-replaceable, thereby allowing user replacement of worn probes and extension of the lifespan of the active stylus 10 as a whole.

Please refer now to FIG. 15 through FIG. 18, four views (perspective, side, side, and cross-sectional) of an embodiment of a hybrid anodized-and-LDS tip. The hybrid tip 600 has a body 602, a bearing 605, an emitting electrode 610, a shield 611, and a sensing electrode 612. The body 602 is composed of a polymer suitable for LDS, and the emitting electrode 610 and the emitting electrode trace 610T are electrolessly plated upon the body 602. The body 602 has a cylindrical hole through it along its longitudinal axis, into which a shield 611, having a flange 611f on its proximal end, can be inserted. The shield 611 likewise has a cylindrical hole through its center aligned with its longitudinal axis, into which a bearing 605 may be inserted, the bearing being a press fit into the hole. The bearing may be a low-friction polymer such as nylon, HDPE, PTFE, or other suitable material with low friction, low conductivity, and long wear characteristics. The sensing electrode 612, comprising sensing electrode shaft 612S and sensing electrode tip 612T, is slidably disposed within the bearing 605 and may be mechanically coupled to a pressure sensor (not shown) such as a diaphragm with one or more strain gauges or a spring and sensor to detect longitudinal depression of the sensing electrode 612 within a housing. The sensing electrode tip 612T may be in the shape of a hemisphere or spherical cap or other smoothly curved surface, and may optionally be wider than the sensing electrode shaft 612S. The body 602 may be formed in the shape of a right circular conic frustum abutting a right circular cylinder, the large base of the frustum being congruent to an end of the cylinder, with the emitting electrode 610 deposited on the side surface of the frustum and the emitting electrode trace 610T being deposited as a thin stripe along the side of the cylindrical portion of the body 602. The shield flange 611F of the shield 611 has a maximum diameter that is at least as large as the larger of the largest diameter of the sensing electrode tip 611T and the diameter of the proximal end of the emitting electrode 610.

In use, the sensing electrode shaft 612S, shield 611, and emitting electrode trace 610T are electrically coupled to their respective contact pads on a PCB 20 having an inverting amplifier circuit 300, 400, 500.

Differentiating a stylus touch from a finger touch is also possible. Touchscreens typically scan their arrays at a refresh rate of 60 Hz. The circuitry of the active stylus can be modified to respond only to every alternate scan, far more frequent than the speed at which a finger could be moved back and forth. The result is a touch that appears and disappears 30 times per second. This imposes some deterioration on the smoothness with which a moving touch can be tracked, but touchscreen manufacturers can increase the refresh rate to compensate; for example, by doubling the refresh rate, this will give the same 60 Hz granularity as existing screens while still allowing a touch from a stylus to be readily distinguishable from a touch made by a fingertip.

Alternately, instead of responding to alternate scans, the stylus electronics can respond to alternate cycles within a given scan. As shown in FIGS. 19 and 20, each 60 Hz scan of the touchscreen rows and columns is performed with a much higher-frequency waveform that allows the touchscreen to check charge/discharge times repeatedly. Because the inverting-amplifier electronics are responding directly to the input signal, instead of using a signal generator, by adding a flip-flop or a similar switch, the electronics can be modified to ignore every second cycle. Furthermore, this may optionally be made configurable, or may be switched automatically by a pressure sensor so that the alternating-cycle response occurs only when the stylus is not physically touching the screen, thereby allowing both hover and touch to be differentiated.

Another alternative is for the stylus to change its response rate only during an initial contact period during the first few cycles after the stylus detects the capacitive flux of a touchscreen or touchpad at a level sufficient to ensure that the touchscreen or touchpad is being influenced by the stylus. This allows the touchscreen firmware and touch-detection software to detect which touch is being generated by a stylus, and to begin tracking that touch. The stylus may then respond to every cycle, thus ensuring smooth interaction and tracking of the touch.

Furthermore, these alternatives may be combined in a single implementation to provide the ability to differentiate between hover and touch.

Please refer now to FIG. 22 through FIG. 26, five views (perspective, front, side, cross-sectional, and expanded, respectively) of an embodiment of a force-sensitive tip. The force-sensitive tip 700 has an emitting electrode 710, a shield 711, and a sensing electrode 712. The emitting electrode 710 has internal threads 710T and a shoulder 710S so that the emitting electrode may be screwed onto a stylus body (not shown) with the shoulder abutting a front end edge of the stylus body. The emitting electrode 710 uses an ogive shaped outer surface 710C to increase the diameter of the electrode nearer the contact with a touchscreen surface, thereby increasing capacitance between the outer surface 710C and a touchscreen surface as a stylus with the tip 700 is brought near a touchscreen surface (as illustrated in FIG. 30), allowing a reduction in the voltage used by the stylus, and hence reducing overall power needs of the active stylus 10. The emitting electrode 710 further has a central hole 710H through which the shield 711, which contains and isolates the sensing electrode 712, protrudes. The shield 711 in this embodiment does not have a flange; its diameter is about the same as the diameter of the sensing electrode tip 712T's widest diameter. The shield 711 is made of a conductive material or materials such as a metal or a conductive polymer, and may be monolithic or made of a plurality of different materials; in some embodiments, the shield 711 is formed of anodized aluminum and has a copper ring 715 press-fit around its distal end 711D to provide a place to form a reliable solder joint with a wire (not shown) while ensuring conductivity to the aluminum portion of the shield 711; in said embodiments, anodizing and surface oxidation of the shield 711 must be removed from the outside surface of the distal end 711D prior to installation of the copper ring 715 in order to ensure maximum conductivity; the anodization is retained elsewhere on the shield to provide insulation between the shield 711 and the sensing electrode 712, and between the shield 711 and the emitting electrode 710. The shield 711 may be a slip fit within the central hole 710H of the emitting electrode 710, or the shield 711 may be of sufficiently smaller diameter than the central hole 710H of the emitting electrode 710 to allow an optional slip-on polymer cap 731 to be placed over the shield 711 and sensing electrode 712. The optional cap 731 provides a low-friction bearing between the shield 711 and the emitting electrode 710 and protects the touchscreen 1 from the tip 712T of the sensing electrode 712. The cap 731 may for example be made of PET, ETFE, PTFE, HDPE, nylon, or another low-friction long-wearing nonconducting polymer, and may be designed to be user-replaceable as it wears out either at its proximal face 731P or along its sides on its bearing surface 731S. The shield 711 may optionally further comprise a retaining ring 711G (shown only in FIG. 26) that the cap 731 can slip over in order to prevent the cap 731 from sliding off. The shield 711 comprises a flange 711F which interacts with travel-limiting blocks (not shown) inside the chassis 11 of a stylus 10 to prevent overtravel in both forward (less force) and rearward (excessive force) directions. The shield 711 has a proximal conduit 711A through its center aligned with its longitudinal axis, into which the sensing electrode 712 fits; the shield 711 also has a distal conduit 711B into which a portion of the PCB (not shown) protrudes; the proximal conduit 711A and distal conduit 711B merge in a flared section 711C, which may optionally be either tapered as shown or squared-off to provide another overtravel prevention stop. This allows the shield 711 to have a narrow tip, desirable for usability reasons, while also accommodating the PCB, which cannot be made too narrow without sacrificing strength. The sensing electrode 712, comprising sensing electrode shaft 712S and sensing electrode tip 712T, is disposed within the shield 711 and is electrically coupled to the PCB (not shown) by spring 721, which also serves to bias the assembly of the sensing electrode 712 and the shield 711 outward from the stylus 10. The distal end of the spring 721D is soldered to the PCB, while the proximal end of the spring 721P rests in a well 712W formed in the back of the sensing electrode 712. The shield 711 may then be mechanically coupled to a force sensor (not shown) such as a gated photodetector and light source, or a diaphragm with one or more strain gauges, or a spring and sensor to detect longitudinal depression of the sensing electrode and shield assembly. The sensing electrode tip 712T may be in the shape of a hemisphere or spherical cap or other smoothly curved surface, and may optionally be wider than the sensing electrode shaft 712S.

In use, the sensing electrode 712, shield 711, and emitting electrode 710 are electrically coupled to their respective contact pads on a PCB 20 having an inverting amplifier circuit 300, 400, 500, 800, 801, 900.

Figure 27:
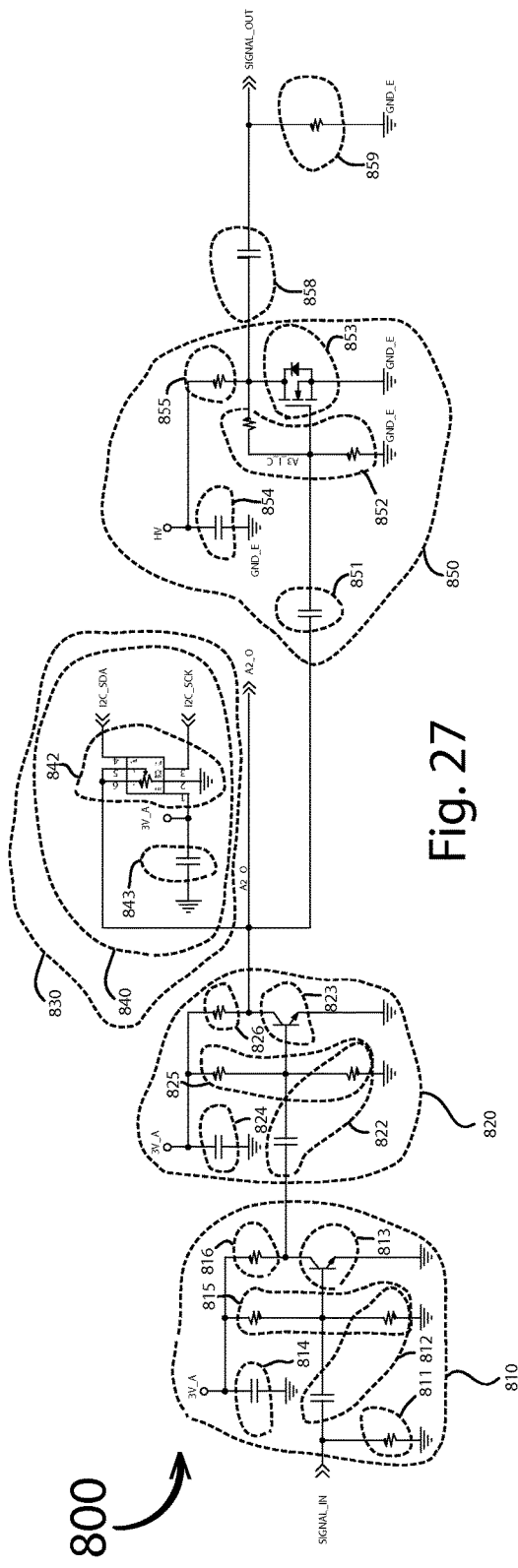
FIG. 27 is a circuit diagram of an inverter-amplifier circuit for an active stylus with a variable power level setting subcircuit.
Figure 28:
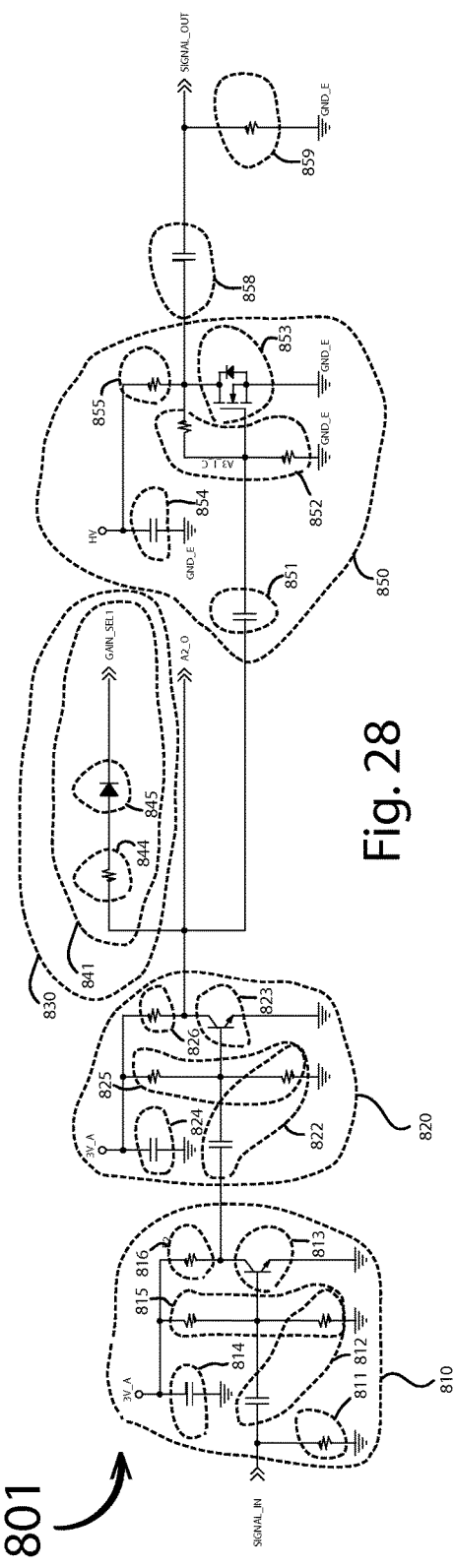
FIG. 28 is a circuit diagram of an inverter-amplifier circuit for an active stylus with a fixed power level setting subcircuit.

Referring now to FIG. 27 and FIG. 28, two variants of a circuit for an active stylus, the circuit 800 or circuit 801 has a first amplification stage 810 and a second amplification stage 820, a signal limiter 830 which may optionally be either an adjustable signal limiter 840 (as shown in FIG. 27 for circuit 800) or a fixed signal limiter 841 (as shown in FIG. 28 for circuit 801), and a driver stage 850.

The first amplification stage 810 receives input from a sensing electrode such as sensing electrode 110, sensing electrode 210, or sensing electrode 710, through the line labeled SIGNAL_IN. Please note, the sensing electrode and touchscreen glass effectively and inherently form a capacitor through which the initial signal passes before being sensed by the sensing electrode. Varistor 811 acts as a protection mechanism for the circuit in the event that the sensing electrode is connected to electrical current, for example, if a misbehaving child sticks the stylus tip into a wall outlet. The signal then passes through a high-pass filter 812 to amplifying transistor 813. Power enters the circuit from the power supply and is filtered by filter capacitor 814. Level-setting resistor pair 815 and output level resistor 816 bring the output of the amplifying transistor 813 back to the input of the amplifying transistor 813 to form a feedback loop, and output from the amplifying transistor 813 along with additional power is output to the second amplification stage 820. The input signal that came from the sensing electrode is inverted and amplified from a peak level of about 20 mV to a peak level of about 200 mV.

The second amplification stage 820 receives its input signal from first amplification stage 810. The input is filtered through high pass filter 822, and is input into the amplifying transistor 823. Power is supplied to the amplifying transistor 823 through output level resistor 826 after having been filtered by filter capacitor 824. Power is fed into the circuit via level-setting resistor pair 825. Output from the second stage amplifier is then sent to both the signal limiter 830 (which may be fixed signal limiter 841 or adjustable signal limiter 840) as well as the driver stage 850. Output from the second amplification stage 820 is at a peak level of about 3V.

The signal limiter 830 is optional, and furthermore may be either adjustable signal limiter 840 as shown in circuit 800 or fixed signal limiter 841 as in circuit 801. Its purpose is to reduce the output power level for certain types of devices with which an active stylus may be used. Certain touchscreens use higher power levels than other touchscreens, and so the output signal would be correspondingly higher unless the circuit 800 or circuit 801 has some way of reducing its output power to compensate. This is desirable both to reduce power requirements (saving battery life in a battery-powered stylus) and to reduce the "wavy line problem" where over-driving the output signal can cause the touchscreen hardware and firmware to move the detected contact point from where the active stylus touches to a different spot because the touchscreen hardware and firmware are being overwhelmed by too much signal. The fixed signal limiter 841 may be chosen either for cost reasons or because the most likely use of the stylus will be with certain known devices. The adjustable signal limiter 840 may be chosen either for development and testing or when the stylus is expected to be used with a large variety of touchscreens whose qualities are not known. Both work by providing a drain path for excess signal; when inhibited, the full signal is sent along from the second amplification stage 820 to the driver stage 850, whereas when not inhibited, part of the signal is dumped to ground thereby reducing the power sent along to the driver stage 850.

Fixed signal limiter 841 is simply a resistor 844, a diode 845, and a gain select line from a microcontroller unit (MCU) (not shown). The resistor 844 forms a divider circuit with resistor 826 of the second amplification stage 820. When the gain select line is powered high, the diode 845 is reverse-biased and so the full power output from the second amplification stage 820 is sent to the driver stage 850. When the gain select line is low, current leaks across the diode 845 and so drains part of the output signal power, thereby causing less power to go to the driver stage 850. In some embodiments, the MCU is in communication with the touchscreen device, which indicates whether the power output should be reduced or should be left at full power, the communication for example being via Bluetooth RF communications hardware.

Adjustable signal limiter 840 comprises a digital resistor 842 in communication with an MCU (not shown) via two I2C standard format communications lines. The MCU (not shown) may receive information from any source to determine at what level to set the digital resistor 842; for example, the MCU may be linked via Bluetooth with software on a touchscreen device (in a production model), or may be set by test equipment (during development). Power is supplied to the digital resistor 842 from the power supply, said power being filtered with filter capacitor 843 so that the digital resistor 842 will behave in a stable manner. The amount of power dumped to ground depends on the ohm level to which digital resistor 842 is set by the MCU. The range is known to the designer, and so may be under as fine a control as is necessary to work with in development or to produce for consumer use.

Output from the second amplification stage 820, as drained (or not drained) by signal limiter 830, finally is sent to the driver stage 850. Input is filtered by filter capacitor 851, and level-setting resistor pair 852 regulates the input signal to driver MOSFET 853. Power to the driver MOSFET 853 is filtered by filter capacitor 854 and set by level-setting resistor 855. Output from driver MOSFET 853 is coupled back to its input via level-setting resistor pair 852 to form a feedback loop, and is also sent as the output from the driver stage 850 through filter capacitor 858 to an emitting tip such as any of emitting electrode 112, 212, 712. A varistor 859 coupled between the output line and ground provides ESD protection to the circuit 800 or the circuit 801 in case of static electricity shock transferred through the output line from an emitting electrode.

Please note that the first amplifier stage 810 and second amplification stage 820, as well as the signal limiter 830, use a first ground (shown by the unlabeled ground), while the driver stage 850 and the final output filter 860 are connected to a second ground (labeled as GND_E). The two grounds are electrically coupled together through a high-ohm resistor. This improves isolation between the two stages to prevent the two stages from interfering with each other.

Figure 29:
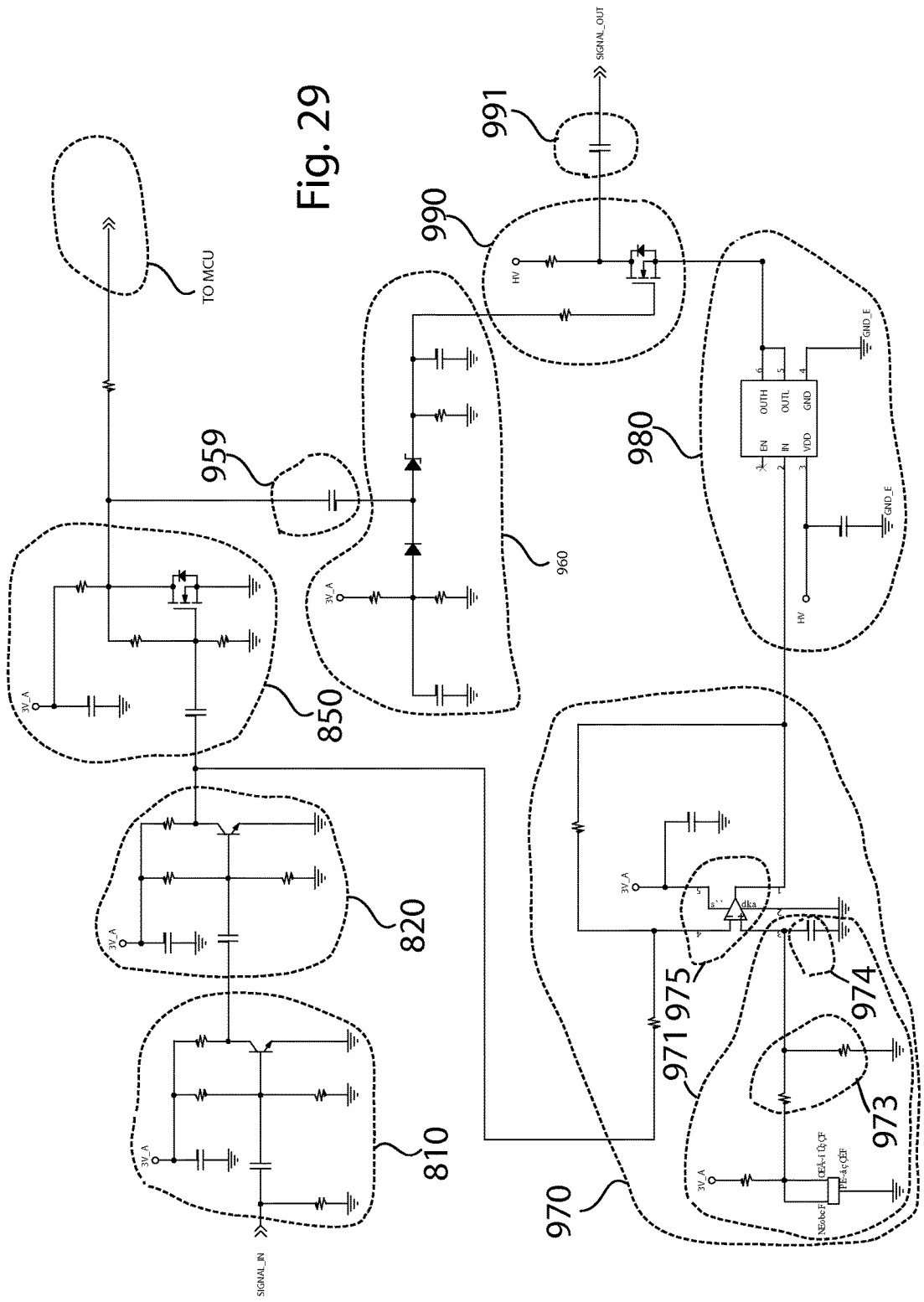
FIG. 29 is a circuit diagram of an inverter-amplifier circuit for an active stylus with circuitry to respond to multiple capacitance lines.

Please refer now to FIG. 29, a circuit for an active stylus. The circuit 900 comprises a first amplification stage 810 and second amplification stage 820 and driver stage 850 as described above for FIG. 27 and FIG. 28. (Please note that values of some components may differ to generate different voltage levels as needed by the overall circuit.)

As in circuit 800 and circuit 801, circuit 900 uses separate grounds electrically coupled by a high-ohmage resistor for the lower voltage and higher voltage subcircuits. Stages 810, 820, 850, 960, 970, and 990 use a common ground, while the final driver stage 980 uses the second ground.

Output from the first amplification stage 810 is sent to the second amplification stage 820. Output from the second amplification stage 820 is sent both to driver stage 850 and to comparator stage 970. Output from the driver stage 850 is sent through filter capacitor 959 to a regulator stage 960. Output from the comparator stage 970 is sent through a final driver stage 980. Output from the regulator stage 960 as well as the final driver stage 980 are sent to output mixer stage 990 which recombines the two signals and outputs them via an emitter electrode. This allows the circuit 900 to adapt to a wide variety of input frequencies and signals from a wide variety of touchscreen devices. A microcontroller unit (MCU) (not shown) also receives the output from the driver stage 850 to determine the presence or absence of signal, to determine the output levels to generate, and to control power to the overall circuit; this saves on battery life.

Regulator stage 960, which may also be a charge pump circuit or integrator circuit, receives its input from the driver stage 850. The regulator stage 960 removes the oscillations from the signal; ideally the regulator stage 960 would output a constant voltage at the peak of the input signal. Due to losses, the regulator stage outputs about 80% to 85% of the input signal peak voltage; when the input signal peaks at 3V, the regulator stage 960 outputs about 2.5V.

The comparator stage 970 has a reference voltage generator 971, supplying the output of reference voltage generator 971 to the non-inverting input of an op-amp 975; this input is supplied through a voltage divider 973 and is filtered by filter capacitor 974 to further stabilize it. The signal from the second amplification stage 820 is supplied to the inverting input of op-amp 975. Feedback from the op-amp 975 output is linked back to the inverting input. Output from the comparator stage 970 is a square wave of the input frequency sensed by the sensing electrode (not shown) ranging from 0V to 3V.

Final driver stage 980 is an IC amplifier, pin 1 of which is always enabled. Power is supplied to pin 3, the square wave output of comparator stage 970 is supplied to pin 2, and output pins 5 and 6 are tied together, outputting a pure square wave matching the input frequency sensed by the sensing electrode (not shown) at between 24V to 30V. This square wave signal is supplied to the output mixer stage 990.

Output mixer stage 990 is a MOSFET power transistor. The voltage level from the regulator stage 960 is applied to the MOSFET gate, the square wave pure frequency signal from the final driver 980 is applied to the MOSFET source, and output from the MOSFET drain is electrically coupled to a high voltage source, for example 30V, through a resistor and the resultant signal is sent through filter capacitor 991 to the emitter electrode; the resultant output signal has its baseline at the high voltage, and when an input signal is being detected it has a square waveform dipping from 30V to some intermediate voltage, said square waveform dipping as low as 0V when an input signal at full voltage is detected. An alternate embodiment has the voltage level from the regulator stage 960 applied to the MOSFET gate, the MOSFET source is connected to ground, and the MOSFET drain is electrically coupled to the final driver 980 output, with the resultant signal sent through a filter capacitor to the emitter electrode; the resultant output signal has its baseline at 0V, and emits a square waveform rising from 0V to some intermediate voltage, said square waveform rising as high as 30V when an input signal at full voltage is detected. Optionally, a varistor (not shown) may be connected after the capacitor 991 to ground to provide for ESD protection.

The embodiments described herein disclose improvements in the field of capacitive sensing, and more particularly, in styluses for interacting with touchscreen and touchpad sensors and other capacitive sensing devices.

We claim as our invention:

1. A tip for an active stylus, comprising:
   an emitting electrode having an internal flange, a distal surface and a proximal edge, wherein the internal flange extends radially outward from the distal surface and the proximal edge is opposite to the distal surface;
   a shield having an external flange comprising an external flange distal surface and an external flange proximal surface, wherein the external flange distal surface abuts the proximal edge of the emitting electrode; and
   a sensing electrode having a distal face, wherein the distal face abuts the external flange proximal surface of the external flange of the shield,
   wherein the emitting electrode is electrically insulated from the shield, and wherein the sensing electrode is electrically insulated from the shield,
   wherein the sensing electrode is fixed in the shield, and the shield is movably disposed within the emitting electrode, and
   wherein the external flange electrically isolates the proximal edge of the emitting electrode from the distal face of the sensing electrode.

2. The tip of claim 1, wherein the sensing electrode is concentrically disposed within the shield, and the shield is concentrically disposed within the emitting electrode.

3. The tip of claim 1, wherein the emitting electrode is electrically insulated from the shield by a layer of anodizing, and the sensing electrode is electrically insulated from the shield by a layer of anodizing.

4. The tip of claim 1, wherein the emitting electrode is electrically insulated from the shield by a polymer layer.

5. A stylus for a capacitive sensor, the stylus comprising:
   a stylus body;
   a circuit disposed within the stylus body;
   a tip, the tip comprising:
     an emitting electrode having an internal flange, a distal surface and a proximal edge, wherein the internal flange extends radially outward from the distal surface and the proximal edge is opposite to the distal surface;
     a shield having an external flange comprising an external flange distal surface and an external flange proximal surface, wherein the external flange distal surface abuts the proximal edge of the emitting electrode; and
     a sensing electrode having a distal face, wherein the distal face abuts the external flange proximal surface of the external flange of the shield, wherein the emitting electrode is electrically insulated from the shield, and wherein the sensing electrode is electrically insulated from the shield, wherein the sensing electrode is fixed in the shield, and the shield is movably disposed within the emitting electrode, wherein the external flange electrically isolates the proximal edge of the emitting electrode from the distal face of the sensing electrode, and wherein the tip is disposed on a proximal end of the stylus body; and a power source, wherein the power source is electrically coupled to the circuit, wherein an input of the circuit is electrically coupled to the sensing electrode of the tip, wherein an output of the circuit is electrically coupled to the emitting electrode of the tip, wherein the circuit receives a signal through the sensing electrode, amplifies and inverts the signal, and outputs the signal through the emitting electrode, and wherein an amplifier of the circuit amplifies only a portion of the signal that exceeds a threshold voltage, by subjecting the signal through at least one level-setting element in each of a plurality of amplifier stages in the amplifier according to the threshold voltage.

6. The stylus of claim 5, wherein the sensing electrode is concentrically disposed within the shield, and the shield is concentrically disposed within the emitting electrode.

7. The stylus of claim 5, wherein the emitting electrode is electrically insulated from the shield by a layer of anodizing, and the sensing electrode is electrically insulated from the shield by a layer of anodizing.

8. The stylus of claim 5, wherein the emitting electrode is electrically insulated from the shield by a polymer layer.

\* \* \* \* \*